(12) United States Patent
Doyle et al.

(10) Patent No.: US 11,765,825 B2
(45) Date of Patent: Sep. 19, 2023

(54) COMPOSITE MATERIALS INCLUDING FILLED HOLLOW GLASS FILAMENTS

(71) Applicant: International Business Machines Corporation, Armonk, NY (US)

(72) Inventors: Matthew S. Doyle, Chatfield, MN (US); Joseph Kuczynski, North Port, FL (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 186 days.

(21) Appl. No.: 16/238,375

(22) Filed: Jan. 2, 2019

(65) Prior Publication Data

US 2019/0141832 A1   May 9, 2019

Related U.S. Application Data

(62) Division of application No. 14/996,766, filed on Jan. 15, 2016, now Pat. No. 10,212,812.

(51) Int. Cl.
*H05K 1/03* (2006.01)
*C08J 5/04* (2006.01)
(Continued)

(52) U.S. Cl.
CPC ............. *H05K 1/0366* (2013.01); *C08J 5/04* (2013.01); *C08K 7/14* (2013.01); *H05K 1/024* (2013.01);
(Continued)

(58) Field of Classification Search
CPC . C08J 7/08; C08J 2300/22; C08J 5/043; C08J 2300/24; C08J 5/08; C08J 5/24; B60B 2360/346; B60B 2360/3462; B60B 2360/341; B60B 2360/34; B60B 2360/348; H01B 3/47; H01G 4/22; H01G 4/206; H01G 4/203; H05K 1/024;
(Continued)

(56) References Cited

U.S. PATENT DOCUMENTS 3,268,313 A   8/1966  Burgman et al.
4,039,718 A   8/1977  Kallenborn
(Continued)

FOREIGN PATENT DOCUMENTS

CN   102256451 A    11/2011
CN   202533604 U    11/2012
(Continued)

OTHER PUBLICATIONS

Rimdusit, Sarawut, et al. "Highly processable ternary systems based on benzoxazine, epoxy, and phenolic resins for carbon fiber composite processing." Journal of Applied Polymer Science 111.3 (2009): 1225-1234. (Year: 2015).*
(Continued)

*Primary Examiner* — Matthew D Matzek
*Assistant Examiner* — Braelyn R Watson
(74) *Attorney, Agent, or Firm* — Patterson + Sheridan, LLP (57) ABSTRACT

In an example, an article of manufacture includes a composite material. The composite material includes hollow glass filaments that are encapsulated within a polymeric matrix material. The hollow glass filaments are at least partially filled with the polymeric matrix material.

20 Claims, 5 Drawing Sheets

(51) Int. Cl.
*C08K 7/14* (2006.01)
*H05K 1/02* (2006.01)

(52) U.S. Cl.
CPC ..... *H05K 1/0248* (2013.01); *H05K 2203/085* (2013.01)

(58) Field of Classification Search
CPC ...... H05K 2201/0254; H05K 3/42–429; C10B 2101/06; Y10T 428/249946; Y10T 442/2992; Y10T 442/604; Y10T 442/605; Y10T 442/612; C03B 37/02781; C03B 37/0756; C03B 37/022; C08K 7/14; C08K 7/24–28; B32B 2262/101; C03C 13/00; D01D 5/24–247
USPC .......... 428/299.4, 901; 442/180; 29/832–841
See application file for complete search history.

(56) References Cited

U.S. PATENT DOCUMENTS

| | | | |
|---|---|---|---|
| 4,206,967 A | 6/1980 | Onoda et al. | |
| 4,405,754 A | 9/1983 | Moczygemba et al. | |
| 4,758,259 A | 7/1988 | Jensen | |
| 4,767,643 A | 8/1988 | Westervelt et al. | |
| 4,877,757 A | 10/1989 | York et al. | |
| 5,360,875 A | 11/1994 | Masse et al. | |
| 5,378,521 A | 1/1995 | Ogawa et al. | |
| 5,408,244 A | 4/1995 | Mackenzie | |
| 5,512,224 A | 4/1996 | Medney et al. | |
| 5,585,147 A | 12/1996 | Ogawa et al. | |
| 5,750,211 A | 5/1998 | Weise et al. | |
| 6,040,363 A | 3/2000 | Warner et al. | |
| 6,083,855 A | 7/2000 | Olson et al. | |
| 6,208,014 B1 | 3/2001 | Wu et al. | |
| 6,344,309 B2 | 2/2002 | Fukushima et al. | |
| 6,478,913 B1* | 11/2002 | Dunleavy | B29C 70/545 |
| | | | 156/289 |
| 6,539,155 B1 | 3/2003 | Broeng et al. | |
| 6,562,410 B1* | 5/2003 | Mayer | C08G 59/68 |
| | | | 427/386 |
| 6,696,155 B1 | 2/2004 | Takano et al. | |
| 6,735,369 B2 | 5/2004 | Komachi et al. | |
| 6,930,254 B2 | 8/2005 | Philips et al. | |
| 7,320,232 B2 | 1/2008 | Paek et al. | |
| 7,615,705 B2 | 11/2009 | Chamberlin et al. | |
| 7,709,371 B2 | 5/2010 | Bhanap et al. | |
| 7,915,166 B1 | 3/2011 | Yu et al. | |
| 8,280,212 B2 | 10/2012 | Goell et al. | |
| 8,433,167 B2 | 4/2013 | Falkenstein et al. | |
| 8,974,888 B2 | 3/2015 | Balcome et al. | |
| 9,456,496 B2 | 9/2016 | Chamberlin et al. | |
| 2001/0008697 A1 | 7/2001 | Fryxell et al. | |
| 2002/0058140 A1 | 5/2002 | Dana et al. | |
| 2003/0129740 A1 | 7/2003 | Seo et al. | |
| 2003/0203174 A1 | 10/2003 | McCarthy et al. | |
| 2004/0113523 A1 | 6/2004 | Hashimoto et al. | |
| 2004/0130877 A1 | 7/2004 | Okubora | |
| 2005/0025967 A1 | 2/2005 | Lawton et al. | |
| 2006/0210901 A1 | 9/2006 | Torigoe et al. | |
| 2007/0202253 A1 | 8/2007 | Ong | |
| 2008/0041105 A1 | 2/2008 | Hahn et al. | |
| 2008/0050076 A1 | 2/2008 | Li et al. | |
| 2008/0240479 A1 | 10/2008 | Linford et al. | |
| 2008/0241523 A1 | 10/2008 | Huignard et al. | |
| 2009/0087646 A1 | 4/2009 | Sirejacob | |
| 2009/0142853 A1 | 6/2009 | Warrington et al. | |
| 2009/0225524 A1 | 9/2009 | Liu et al. | |
| 2010/0056721 A1 | 3/2010 | Wright et al. | |
| 2010/0212944 A1 | 8/2010 | Gelorme et al. | |
| 2010/0316868 A1 | 12/2010 | David et al. | |
| 2011/0214909 A1 | 9/2011 | Boday et al. | |
| 2012/0033923 A1 | 2/2012 | Takenaga et al. | |
| 2013/0014977 A1 | 1/2013 | Chamberlin et al. | |
| 2013/0016465 A1 | 1/2013 | Chamberlin et al. | |
| 2013/0052409 A1* | 2/2013 | Balcome | H05K 3/28 |
| | | | 427/96.8 |
| 2013/0126217 A1 | 5/2013 | Yamaguchi et al. | |
| 2013/0309809 A1 | 11/2013 | Eckhardt et al. | |
| 2015/0189746 A1* | 7/2015 | Liao | C08G 59/4261 |
| | | | 524/413 |
| 2016/0242280 A1 | 8/2016 | Chamberlin et al. | |
| 2016/0330834 A1 | 11/2016 | Chamberlin et al. | |
| 2017/0204253 A1 | 7/2017 | Doyle et al. | |

FOREIGN PATENT DOCUMENTS

| | | |
|---|---|---|
| CN | 104486914 A | 4/2015 |
| DE | 102006016400 A1 | 3/2007 |
| EP | 2286292 A2 | 2/2011 |
| ES | 2529366 T3 | 2/2015 |
| JP | 11147960 | 6/1999 |
| JP | 3877152 B2 | 2/2007 |
| JP | 5355384 B2 | 11/2013 |
| WO | 2009148492 A2 | 12/2009 |

OTHER PUBLICATIONS

PCB Resin Distribution Fiber for Resin Starvation Prevention, Oct. 1, 2015, obtained from IP.com (Year: 2015).*

Wypych, George. (2010). Handbook of Fillers (3rd Edition)—5.30 Electrical Properties. ChemTec Publishing, pp. 272-274. Retrieved from https://app.knovel.com/hotlink/pdf/id:kt007C1963/handbook-fillers-3rd/physical-p-electrical (Year: 2010).*

Wiley-VCH. (2016). Ullmann's Polymers and Plastics—Products and Processes, 4 Volume Set—58, p. 1653 Table 5. Diglycidyl Ether of Bisphenol A, DGEBA-Based Epoxy Resins. Retrieved from https://app.knovel.eom/hotlink/pdf/id:kt011CBK6F/ullmanns-polymers-plastics/solid-epoxy-resins-based (Year: 2016).*

Sood, Bhanu, and Michael Pecht. "Printed circuit board laminates." Wiley Encyclopedia of Composites (2011): 1-11. (Year: 2011).*

Wallenberger, Frederick T., et al., eds. Advanced inorganic fibers: processes—structure—properties—applications. vol. 6, Ch. 6, Springer Science & Business Media, 2011 (Year: 2011).*

Pang, J., and I. Bond. "'Bleeding composites'—damage detection and self-repair using a biomimetic approach." Composites Part A: Applied Science and Manufacturing 36, No. 2 (2005): 183-88. doi:10.1016/s1359-835x(04)00166-6. (Year: 2005).

Hara, Osamu. "Curing Agents for Epoxy Resin." ThreeBond Technical News, Dec. 20, 1990, 1-10. (Year: 1990).

Park, Sao-Jin, Min-Kang Seo, and Jae-Rock Lee. "Isothermal cure kinetics of epoxy/phenol-novolac resin blend system initiated by cationic latent thermal catalyst." Journal of Polymer Science Part A: Polymer Chemistry 38, No. 16 (2000): doi:10.1002/1099-0518(20000815)38:16<2945::aid-pola120>3.0.co;2-6. (Year: 2000).

"GigaSync Low Loss, Low Skew Laminate and Prepreg", isola, http:/web.archive.org/web/20150906091124/http:l/www.isola-group.com/wpcontent/uploads/2014/04/GigaSync-Low-Loss-Low-Skew-Laminate-and-Prepreg-Data-Sheet-Isola.pd!, retrieved on Sep. 6, 2015, 2 pages.

Wallenberger et al., "Fiberglass and Glass Technology: Energy-Friendly Compositions and Applications", Springer Science & Business Media, Nov. 27, 2009, 478 pages, pp. 49-50.

"Hollow glass fibres (H-glass): A new low density structural material", R&G Faserverbundwerkstoffe GmbH, downloaded from <http://www.r-g.de/w/images/c/ca/Td_en_hollow_glass.pdf>on Nov. 26, 2014, 1 page.

Plueddemann, "Silane Coupling Agents," 2nd edition, Plenum Press, New York, 1991, Table 1_10 "Critical Surface Tensions of Silane Coupling Agent Film" (p. 23) and Table 2.2 "Representative Commercial Si lanes" (p. 34).

http:/fwww.ami.ac.uk/courses/topics/0152_caf/index.html, "The CAF mechanism," 5 pages, document accessed Aug. 6, 2011.

http:/fwww.wou.edu/las/physci/ch462/redox.htm, "Diagrams That Provide Useful Oxidation-Reduction Information," 5 pages, document accessed Aug. 6, 2011.

(56) References Cited

OTHER PUBLICATIONS

IBM, "List of IBM Patents or Patent Applications Treated as Related," for U.S. Appl. No. 16/238,375, titled Composite Materials Including Filled Hollow Glass Filaments, as filed on Jan. 2, 2019.

Murai et al., "Newly Developed Low-Transmission-Loss Multilayer Materials for PWBs Applied to High GHz Bands", Hitachi Chemical Co_ Ltd., downloaded from <http://www-03.ibm.com/procurementfproweb.nsf/objectdocswebview/filepcb+-+ibm+101809+hitachi+chemical.pdf/$file/ibm+101809+hitachi+chem_pdf> on Dec. 10, 2014, pp. 1-31.

* cited by examiner

COMPOSITE MATERIALS INCLUDING FILLED HOLLOW GLASS FILAMENTS

CROSS-REFERENCE TO RELATED APPLICATIONS

This application is a divisional of co-pending U.S. patent application Ser. No. 14/996,766, filed Jan. 15, 2016. The aforementioned related patent application is herein incorporated by reference in its entirety.

FIELD OF THE DISCLOSURE

The present disclosure relates generally to composite materials including filled hollow glass filaments.

BACKGROUND

As signal speeds increase, the phenomenon of skew is becoming a more important printed circuit board design consideration. One approach to skew mitigation includes the use of spread glass, where pitch between glass fiber bundles of a glass cloth is reduced, which may mitigate the skew problem. As another example, rotating an image (e.g., by 10 degrees) may offset skew to a certain extent, but at the cost of using more area.

SUMMARY OF THE DISCLOSURE

According to an embodiment, an article of manufacture is disclosed that includes a composite material. The composite material includes hollow glass filaments that are encapsulated within a polymeric matrix material. The hollow glass filaments are at least partially filled with the polymeric matrix material.

According to another embodiment, a process is disclosed that includes coating a glass fiber substrate that includes hollow glass filaments with a resin mixture and causing the resin mixture to flow into open ends of the hollow glass filaments. The resin mixture includes a resin and a curing agent. The process also includes partially curing the resin to form a pre-impregnated material.

According to another embodiment, a process is disclosed that includes forming a through-hole in a printed circuit board core layer. The printed circuit board core layer includes a glass fiber substrate of hollow glass filaments, and forming the through-hole exposes open ends of the hollow glass filaments. The process also includes causing a resin mixture that includes a resin and a curing agent to flow into the open ends of the hollow glass filaments.

One advantage of the present disclosure is the ability to reduce skew in a printed circuit board by reducing a dielectric mismatch between a fiberglass material and a resin material by at least partially filling hollow glass filaments with the resin material.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

DETAILED DESCRIPTION

The present disclosure describes composite materials including hollow glass filaments that are (at least partially) filled with a fill material and processes of forming such composite materials (and associated articles of manufacture, such as pre-impregnated materials, printed circuit board core layers, printed circuit boards). In the present disclosure, the fill material (e.g., a resin, such as an epoxy-based resin) is selected to reduce a dielectric mismatch between materials in order to reduce skew in a printed circuit board that is manufactured using the composite materials. To reduce the dielectric mismatch between a glass material and a polymeric matrix material that encapsulates the glass material, the fill material is selected such that an effective dielectric constant of a filled portion of a hollow glass filament is more closely matched to a dielectric constant of the encapsulating polymeric matrix material in order to reduce skew associated with dielectric mismatch between materials in a printed circuit board.

A dielectric constant (Dk), also referred to as relative permittivity, is a parameter that may be used to characterize dielectric loss in a printed circuit board. In a printed circuit board laminate, the Dk is the ratio of the capacitance between a pair of conductors separated by a dielectric material (e.g., an epoxy-based resin) compared to the capacitance between that pair of conductors in a vacuum. The Dk of a printed circuit board laminate may vary, depending on a printed circuit board substrate material as well as a signal frequency. Printed circuit boards are generally constructed of a glass cloth or other glass fiber substrate impregnated with a varnish coating (e.g., a resin). As differential pairs (i.e., two complementary transmission lines that transfer equal and opposite signals down their length) are routed through a printed circuit board, the transmission time of the differential pair closest to a glass fiber propagates the signal more slowly because the dielectric constant of the glass fiber is higher than the dielectric constant of the resin, resulting in skew.

Conventional hollow glass fibers may be unsuitable for use in printed circuit boards due to moisture incursion and formation of conductive anodic filament (CAF) pathways between printed through-holes (PTHs). In the present disclosure, a fill material (e.g., a resin) may be used to prevent moisture incursion and the formation of CAF pathways, and the fill material may be selected such that a filled portion of a hollow glass filament has an effective dielectric constant that reduces dielectric material mismatch that may be associated with skew in a printed circuit board.

Figure 1:
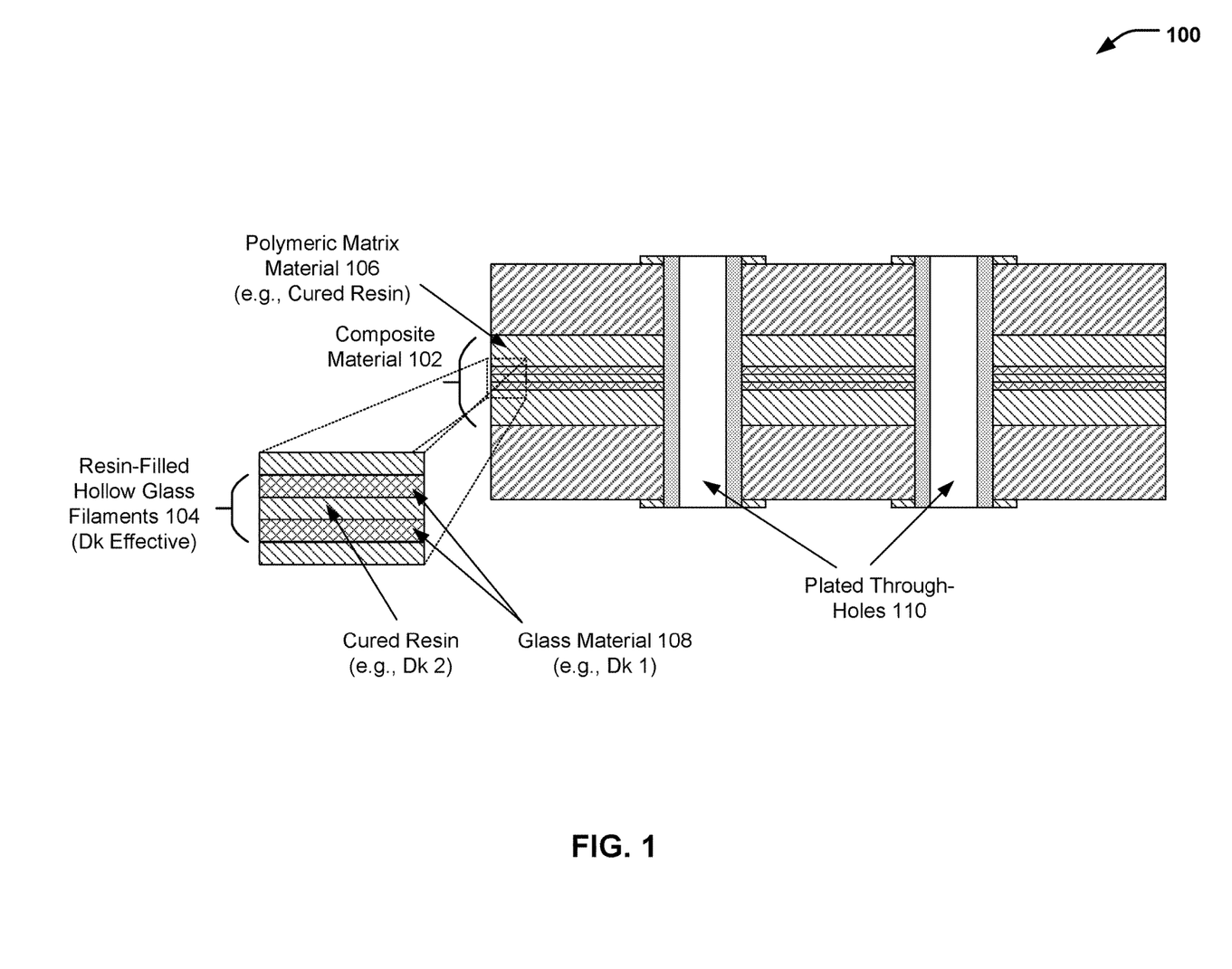
FIG. 1 is a diagram of a portion of an article of manufacture (e.g., a printed circuit board) that includes a composite material with hollow glass filaments that are at least partially filled with a material to reduce dielectric mismatch in order to mitigate/prevent skew, according to one embodiment.

FIG. 1 is a diagram 100 illustrating a particular embodiment of an article of manufacture (e.g., a printed circuit board) that includes a composite material 102. The composite material 102 includes a glass fiber substrate including hollow glass filaments 104 that are encapsulated within a polymeric matrix material 106 (e.g., a cured resin, such as an epoxy-based resin) and that are at least partially filled with a fill material. In the example of FIG. 1, the hollow glass filaments 104 are filled with the polymeric matrix material 106. As described further herein with respect to FIG. 2, in some cases, one material (e.g., a first resin having a first viscosity) may be used to encapsulate a glass fiber substrate, and another material (e.g., a second resin having a second viscosity) may be used to fill at least a portion of the hollow glass filaments of the glass fiber substrate. As described further herein, the fill material may be selected such that a filled portion of a hollow glass filament has a reduced effective dielectric constant to reduce a dielectric material mismatch that may be associated with skew in a printed circuit board.

The hollow glass filaments 104 illustrated in FIG. 1 are formed from a glass material 108 having a first dielectric constant (illustrated as "Dk 1" in FIG. 1), and the material that fills at least a portion of the hollow glass filaments 104 (e.g., the polymeric matrix material 106 in the example of FIG. 1) has a second dielectric constant (illustrated as "Dk 2" in FIG. 1). As shown in FIG. 1, the resin-filled hollow glass filaments 104 may be located between plated through-holes 110 in a printed circuit board. The second dielectric constant is less than the first dielectric constant, such that (after curing) a filled portion of a hollow glass filament has an effective dielectric constant (illustrated as "Dk Effective" in FIG. 1). The effective dielectric constant is less than the first dielectric constant and is greater than the second dielectric constant. In order to mitigate/prevent skew, the fill material that is used for a particular glass material (e.g., E-glass) may be selected such that a difference between the effective dielectric constant and the second dielectric constant is sufficient to satisfy a dielectric mismatch threshold associated with skew in a printed circuit board.

A hollow glass filament has an inner diameter and an outer diameter, and the rule of mixtures may be used to determine an effective dielectric constant of a resin-filled portion of the resin-filled hollow glass filaments 104. As an illustrative, non-limiting example, a hollow glass filament may have an outer diameter of 25 μm and an inner diameter of 20 μm (corresponding to a glass "shell" of 5 μm). In this example, the volume fraction of resin in the resin-filled hollow glass filaments 104 is about 51%. In a particular embodiment, the hollow glass filaments may be formed from an E-glass material having a dielectric constant in a range of 6.0 to 6.5 at 1 GHz, such as in a range of 6.05 to 6.45 at 1 GHz, or in a range of 6.1 to 6.4 at 1 GHz. As an illustrative, non-limiting example, the E-glass material may have a dielectric constant of about 6.13 at 1 GHz. In a particular embodiment, the resin fill material (after curing) has a dielectric constant in a range of 3 to 3.6 at 1 GHz, such as in a range of 3.05 to 3.45 at 1 GHz, or in a range of 3.1 to 3.5 at 1 GHz. As an illustrative, non-limiting example, the resin may have a dielectric constant of about 3.23 at 1 GHz. Depending on the particular volume fraction associated with the resin, the effective dielectric constant of the resin-filled portion of the hollow glass filament may be in a range of 4 to 5 at 1 GHz, such as in a range of 4.1 to 4.9 at 1 GHz, or in a range of 4.2 to 4.8 at 1 GHz.

Thus, FIG. 1 illustrates an example of an article of manufacture (e.g., a printed circuit board) that includes a composite material including a glass fiber substrate including hollow glass filaments that are at least partially filled with a fill material (e.g., a resin) to reduce dielectric material mismatch that may be associated with skew in a printed circuit board.

Figure 2:
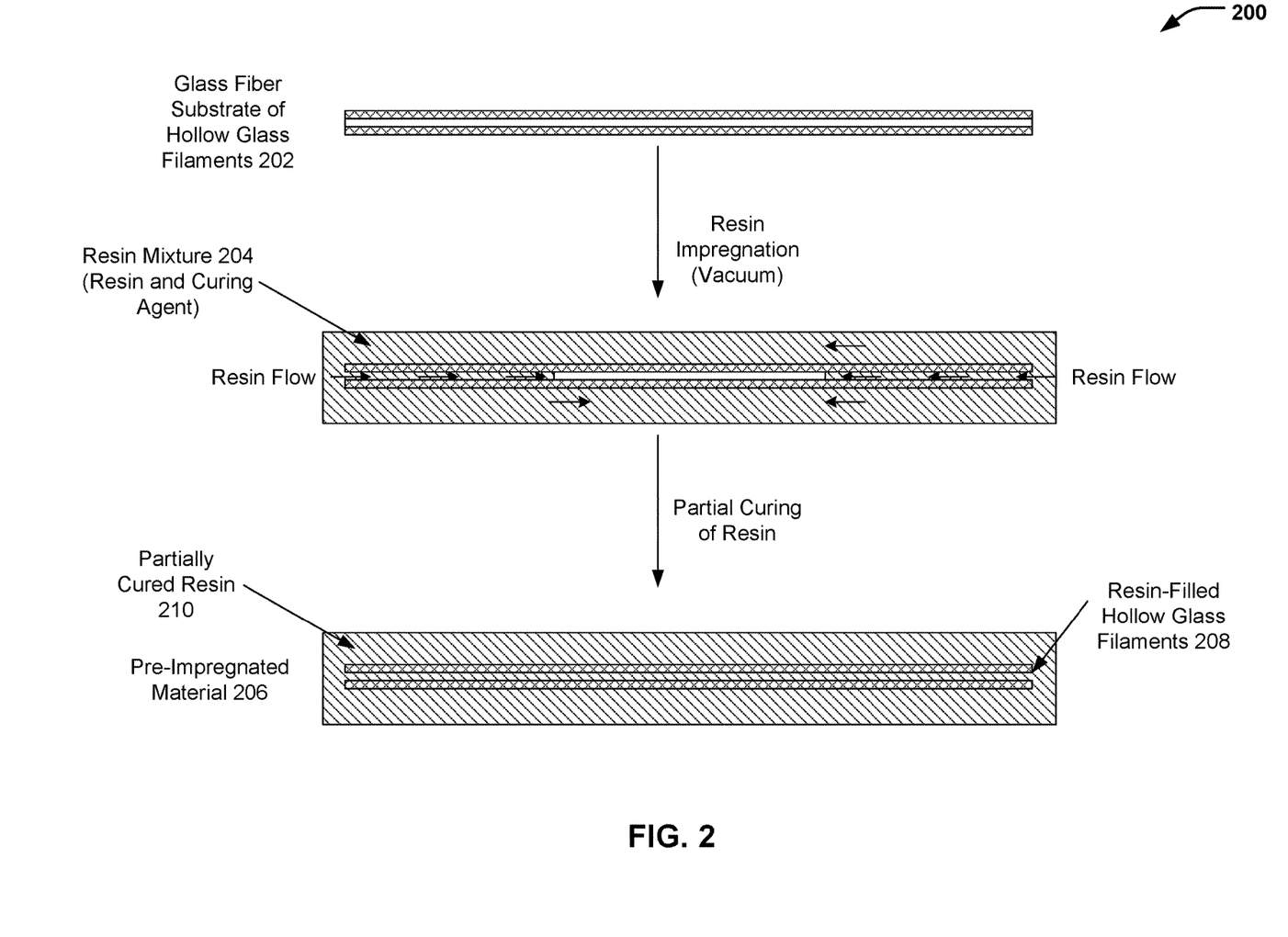
FIG. 2 is a diagram of a process of forming an article of manufacture (e.g., a pre-impregnated material) that includes a composite material with hollow glass filaments that are at least partially filled with a material to reduce dielectric mismatch in order to mitigate/prevent skew, according to one embodiment.

FIG. 2 is a diagram 200 illustrating a particular embodiment of a process of forming an article of manufacture (e.g., a pre-impregnated material) that includes a composite material including hollow glass filaments that are at least partially filled with a resin (e.g., a partially cured resin). After curing, a portion of a hollow glass filament that is filled with the resin may have an effective dielectric constant that is closer to a surrounding resin in order to mitigate/prevent skew in a printed circuit board.

The process includes coating a glass fiber substrate 202 that includes hollow glass filaments with a resin mixture 204 that includes a resin and a curing agent. The curing agent may include an amine curing agent or an anhydride curing agent, among other alternatives. The process includes causing the resin mixture 204 to flow into open ends of the hollow glass filaments. For example, reducing a pressure may induce the resin mixture 204 to flow into the open ends of the hollow glass filaments. To illustrate, an applied vacuum may draw air out of hollow glass filaments and facilitate wicking. Removing the air from the hollow glass filaments allows the resin mixture 204 to wick along the interior length of the hollow glass filaments.

The process includes partially curing the resin to form a pre-impregnated material 206. The pre-impregnated material 206 includes resin-filled hollow glass filaments 208 that are filled with a partially cured resin 210. While not shown in FIG. 2, the partially cured resin 210 of the pre-impregnated material 206 may be subsequently cured (e.g., B-staged) during a process of forming a printed circuit board core layer. The hollow glass filaments of the glass fiber substrate 202 are formed from a glass material having a first dielectric constant. After the partially cured resin 210 is cured, the cured resin has a second dielectric constant that is less than the first dielectric constant. The portion of a hollow glass filament that is filled with the cured resin (corresponding to the portion that is filled with the partially cured resin 210) has an effective dielectric constant that is less than the first dielectric constant and that is greater than the second dielectric constant.

The material that is used to fill the hollow glass filaments may be selected such that the difference between the effective dielectric constant and the second dielectric constant satisfies a dielectric match threshold associated with skew in a printed circuit board. To illustrate, in some embodiments, the glass material of the glass fiber substrate 202 may be an "E-glass" material. The dielectric constant of the E-glass material may be in a range of 6.0 to 6.5 at 1 GHz, such as in a range of 6.05 to 6.45 at 1 GHz, or in a range of 6.1 to 6.4 at 1 GHz. As an illustrative, non-limiting example, the E-glass material may have a dielectric constant of about 6.13 at 1 GHz. In a particular embodiment, the resin fill material (after curing) has a dielectric constant in a range of 3 to 3.6 at 1 GHz, such as in a range of 3.05 to 3.44 at 1 GHz, or in a range of 3.1 to 3.5 at 1 GHz. As an illustrative, non-limiting example, the resin may have a dielectric constant of about 3.23 at 1 GHz. Depending on the particular volume fraction associated with the resin, the effective dielectric constant of the resin-filled portion of the hollow glass filament may be in a range of 4 to 5 at 1 GHz, such as in a range of 4.1 to 4.9 at 1 GHz, or in a range of 4.2 to 4.8 at 1 GHz.

Thus, FIG. 2 illustrates an example of a process of forming a composite material (e.g., a pre-impregnated material) including hollow glass filaments that are at least partially filled with a resin (e.g., a partially cured resin, in the case of a pre-impregnated material). After curing, a resin-filled portion of a hollow glass filament may have an effective dielectric constant that is closer to a surrounding resin in order to mitigate/prevent skew in a printed circuit board.

Figure 3:
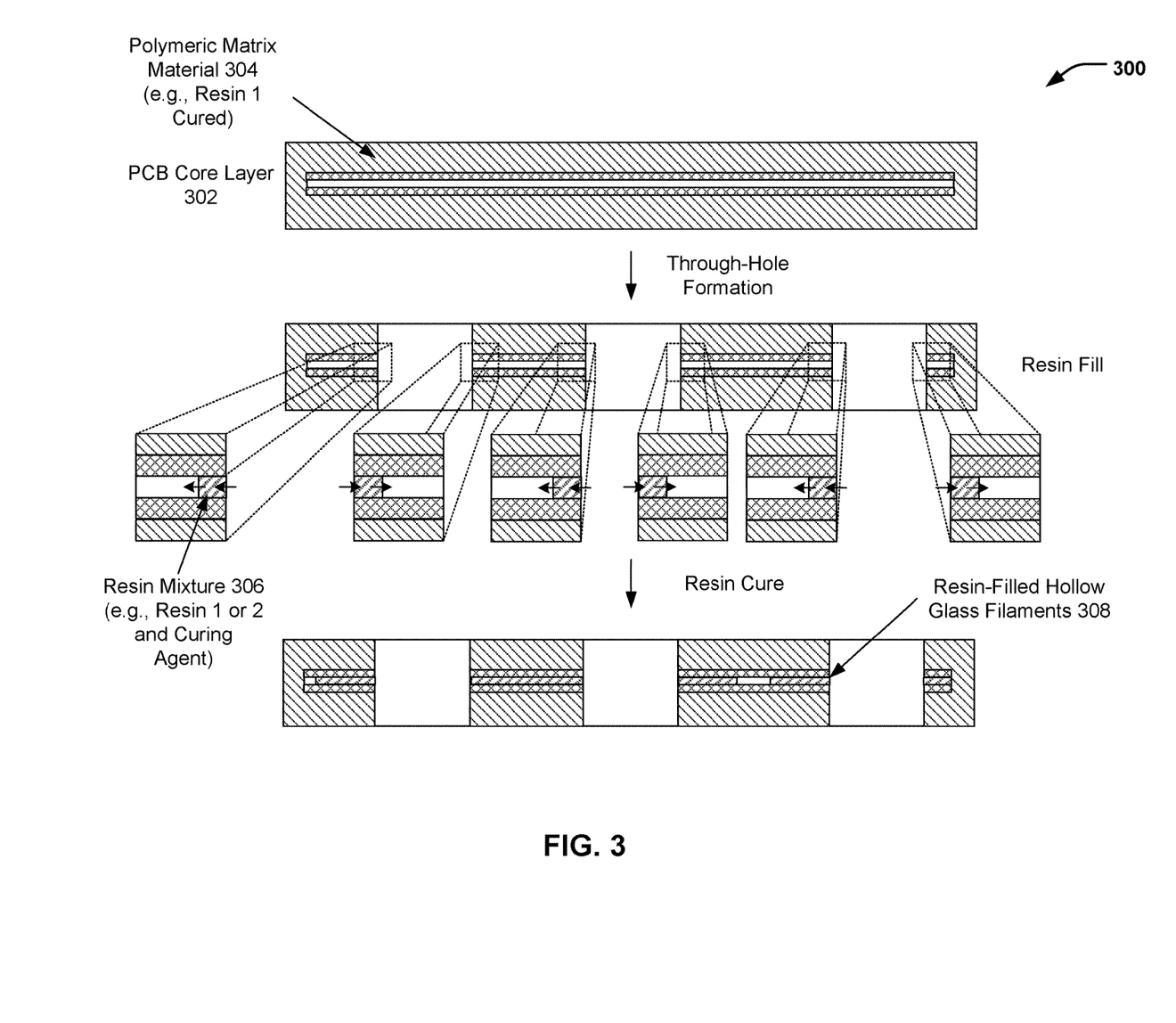
FIG. 3 is a diagram of a process of forming an article of manufacture (e.g., a printed circuit board) that includes a composite material with hollow glass filaments that are at least partially filled with a material to reduce dielectric mismatch in order to mitigate/prevent skew, according to one embodiment.

FIG. 3 is a diagram 300 illustrating a particular embodiment of a process of forming an article of manufacture (e.g., a printed circuit board) that includes a composite material including hollow glass filaments that are at least partially filled with a resin material. A portion of a hollow glass filament that is filled with the resin may have an effective dielectric constant that is closer to a surrounding resin in order to mitigate/prevent skew in a printed circuit board.

In FIG. 3, a printed circuit board core layer 302 includes a glass fiber substrate of hollow glass filaments encapsulated within a polymeric matrix material 304 (e.g., a cured resin). The process includes forming a through-hole (or multiple through-holes) in the printed circuit board core layer 302 to expose open ends of the hollow glass filaments. The process includes causing a resin mixture 306 (including a resin and a curing agent, such as a thermal initiator) to flow into the open ends of the hollow glass filaments that are exposed at the through-hole location(s) to at least partially fill the hollow glass filaments, identified as resin-filled hollow glass filaments 308 in FIG. 3.

While not shown in FIG. 3, the printed circuit board core layer 302 may be formed from a pre-impregnated material that is coated with a first resin having a first viscosity. In some cases, the resin that is included in the resin mixture 306 may include a second resin having a second viscosity that is less than the first viscosity (e.g., in order to enable the second resin to flow into the open ends of the hollow glass filaments).

FIG. 3 illustrates an example in which one or more of the hollow glass filaments of the glass fiber substrate encapsulated within the polymeric matrix material 304 of the printed circuit board core layer 302 may be partially filled with the resin mixture 306. As an illustrative, non-limiting example, an average wick length of the resin mixture 306 may be less than 500 μm from an open end of a hollow glass filament. FIG. 3 illustrates that distance(s) between through-holes and resin viscosity (among other factors) may determine whether a particular hollow glass filament is partially filled or completely filled with the resin mixture 306. To illustrate, in the event that a distance between one through-hole and another through-hole is greater than the wick length into the hollow glass filament from open end(s) in one or more through-holes (e.g., greater than a combined wick length of less than 1000 μm, based on a wick length of less than 500 μm from each direction in the case of two through-holes), the hollow glass filament may not be completely filled. However, the effective dielectric constant of the portion of the hollow glass filament that is filled (adjacent to a through-hole) may be sufficient to reduce the dielectric mismatch in order to mitigate/prevent skew. FIG. 3 further illustrates that, after causing the resin mixture 306 to fill at least a portion of the hollow glass filaments, the process includes curing the resin in place (e.g., by subjecting the printed circuit board to a thermal bake cycle).

The material that is used to fill the hollow glass filaments may be selected such that the difference between an effective dielectric constant of the resin-filled portion and a dielectric constant of the polymeric matrix material 304 satisfies a dielectric mismatch threshold associated with skew in a printed circuit board. To illustrate, in some embodiments, the glass material of the printed circuit board core layer 302 may be an "E-glass" material. The dielectric constant of the E-glass material may be in a range of 6.0 to 6.5 at 1 GHz, such as in a range of 6.05 to 6.45 at 1 GHz, or in a range of 6.1 to 6.4 at 1 GHz. As an illustrative, non-limiting example, the E-glass material may have a dielectric constant of about 6.13 at 1 GHz. In a particular embodiment, the resin fill material (after curing) has a dielectric constant in a range of 3 to 3.6 at 1 GHz, such as in a range of 3.05 to 3.44 at 1 GHz, or in a range of 3.1 to 3.5 at 1 GHz. As an illustrative, non-limiting example, the resin may have a dielectric constant of about 3.23 at 1 GHz. Depending on the particular volume fraction associated with the resin, the effective dielectric constant of the resin-filled portion of the hollow glass filament may be in a range of 4 to 5 at 1 GHz, such as in a range of 4.1 to 4.9 at 1 GHz, or in a range of 4.2 to 4.8 at 1 GHz.

Thus, FIG. 3 illustrates an example of a process of forming a composite material (e.g., a printed circuit board) including hollow glass filaments that are at least partially filled with a resin (that may be the same resin that is used to impregnate a glass fiber substrate of the hollow glass filaments or a different resin). After curing, a resin-filled portion of a hollow glass filament may have an effective dielectric constant that is closer to a surrounding resin in order to mitigate/prevent skew in a printed circuit board.

Figure 4:
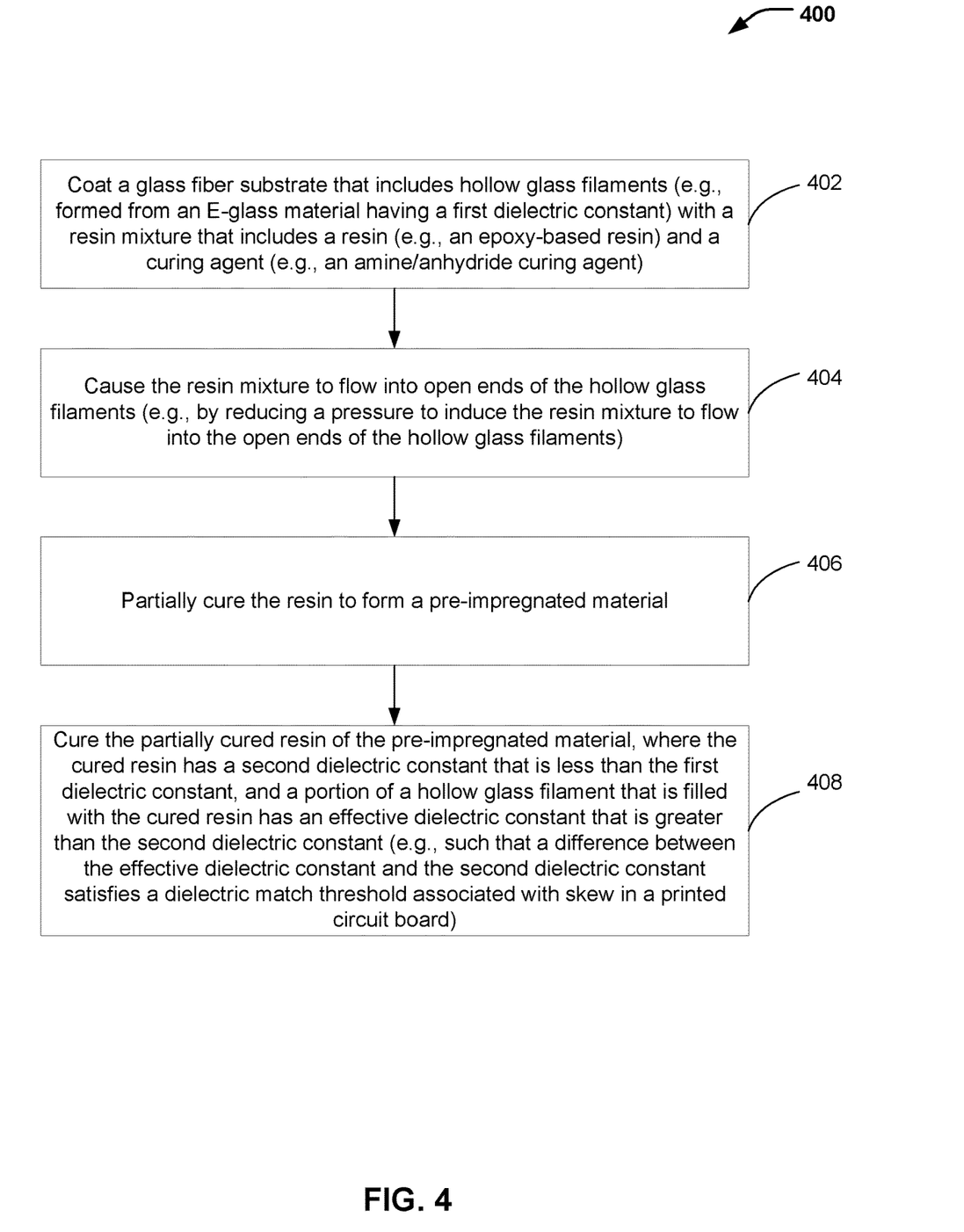
FIG. 4 is a flow diagram showing a particular embodiment of a process of forming a composite material including hollow glass filaments that are at least partially filled with a resin material.

Referring to FIG. 4, a flow diagram illustrates a particular embodiment of a process 400 of forming a composite material including hollow glass filaments that are at least partially filled with a resin material. In the example of FIG. 4, during impregnation of a glass fiber substrate of hollow glass filaments, reduced pressure may cause an impregnating resin to not only coat/encapsulate the hollow glass filaments but also flow into open ends of the hollow glass filaments to form a pre-impregnated material where the encapsulating resin is the same as the resin that fills the hollow glass filaments. Filling the hollow glass filaments with a material having a dielectric constant that is less than a dielectric constant of a glass material reduces a dielectric mismatch between the glass material and the encapsulating resin. A reduction of a difference between an effective dielectric constant of a resin-filled portion of a hollow glass filament and the dielectric constant of the encapsulating resin may be sufficient to mitigate/prevent skew in a printed circuit board.

In the particular embodiment illustrated in FIG. 4, operations associated with an example process of forming a pre-impregnated material including a partially cured resin are identified as operations 402-406, while operations associated with curing the partially cured resin are illustrated as operation 408. It will be appreciated that the operations shown in FIG. 4 are for illustrative purposes only and that the operations may be performed at alternative times, by a single entity or by multiple entities, or a combination thereof. As an example, one entity (e.g., a fiberglass manufacturer) may perform operations associated forming hollow glass filaments, the same or different entity may perform operations associated with forming a glass fiber substrate from the hollow glass filaments, while another entity (e.g., a pre-impregnated material manufacturer) may form a pre-impregnated material that includes the glass fiber substrate. Further, alternative or additional entities (e.g., a printed circuit board manufacturer) may perform operations associated with curing the partially cured resin of the pre-impregnated material.

The process 400 includes coating a glass fiber substrate that includes hollow glass filaments with a resin mixture that includes a resin and a curing agent, at 402. For example, referring to FIG. 2, the glass fiber substrate 202 of hollow glass filaments may be coated with the resin mixture 204.

The process 400 includes causing the resin mixture to flow into open ends of the hollow glass filaments, at 404. For example, referring to FIG. 2, the resin mixture 204 may be induced to flow into open ends of the hollow glass filaments of the glass fiber substrate 202 (e.g., by applying a vacuum to draw air out of the hollow glass filaments in order to facilitate wicking of the resin mixture 204 into the open ends of the hollow glass filaments).

The process 400 includes partially curing the resin to form a pre-impregnated material, at 406. For example, referring to FIG. 2, the pre-impregnated material 206 may be formed by partially curing the resin included in the resin mixture 204.

In the embodiment illustrated in FIG. 4, the process 400 further includes curing the partially cured resin of the pre-impregnated material, at 408. For example, referring to FIG. 2, the partially cured resin 210 of the pre-impregnated material 206 may be cured to form a printed circuit board core layer (e.g., for use in fabricating the printed circuit board illustrated in FIG. 1).

Thus, FIG. 4 illustrates an example of a process of forming a composite material (e.g., a pre-impregnated material) that includes a glass fiber substrate including hollow glass filaments that are encapsulated within a polymeric matrix material (e.g., a partially cured resin) and that are at least partially filled with the polymeric matrix material. FIG. 4 further illustrates that an article of manufacture (e.g., a printed circuit board) may be formed from the composite material (e.g., by curing the partially cured resin). Filling at least a portion of a hollow glass filament with a material having a dielectric constant that is less than a dielectric constant of a glass material reduces a dielectric mismatch between the glass material and the encapsulating resin. A reduction of a difference between an effective dielectric constant of a resin-filled portion of a hollow glass filament and the dielectric constant of the encapsulating resin may be sufficient to mitigate/prevent skew in a printed circuit board.

Figure 5:
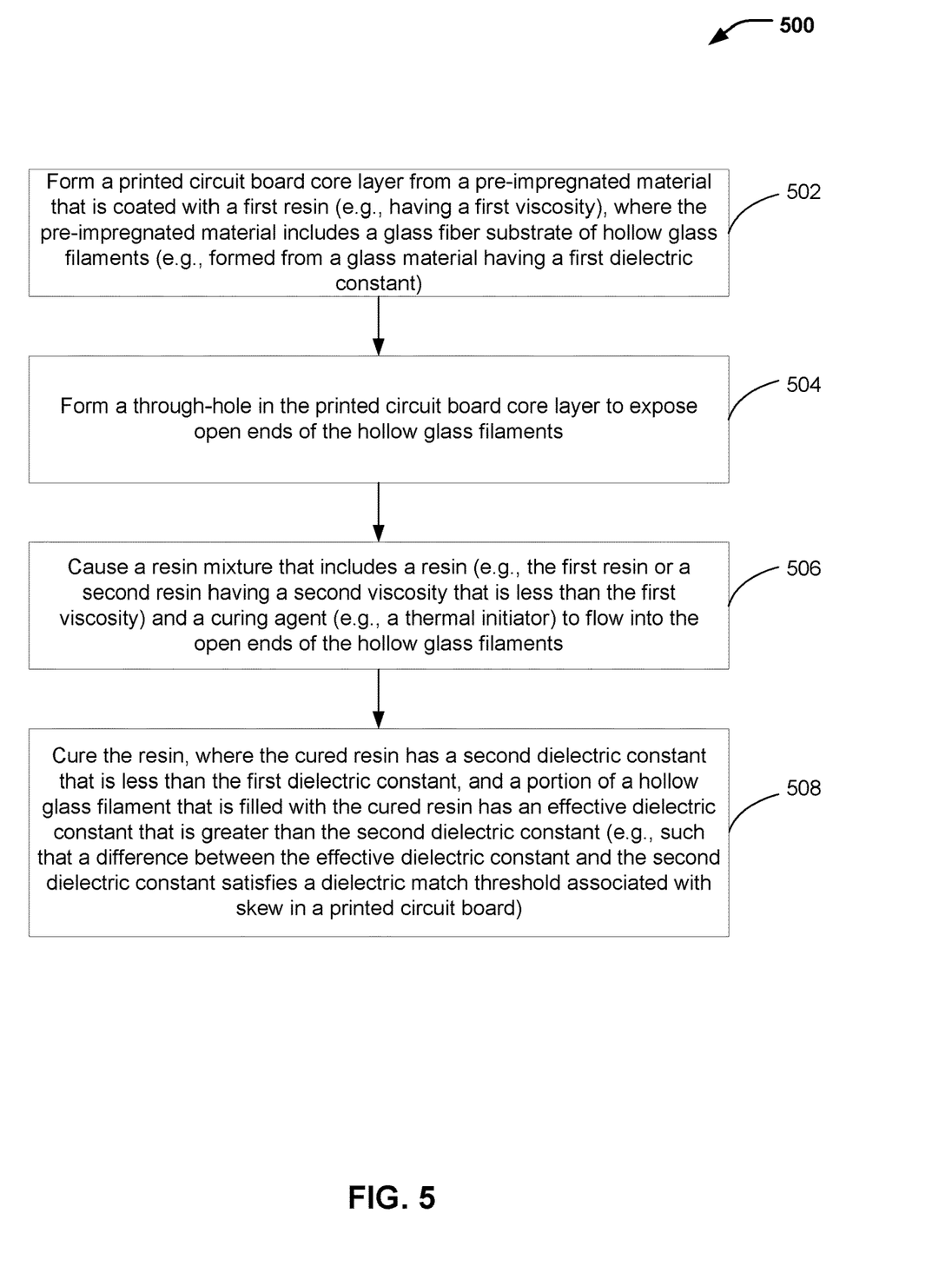
FIG. 5 is a flow diagram showing a particular embodiment of a process of forming a composite material including hollow glass filaments that are at least partially filled with a resin material.

Referring to FIG. 5, a flow diagram illustrates a particular embodiment of a process 500 of forming a composite material including hollow glass filaments that are at least partially filled with a resin material. In the example of FIG. 5, resin may be induced to flow into open ends of hollow glass filaments of a printed circuit board core layer to at least partially fill the hollow glass filaments. Filling at least a portion of the hollow glass filaments with a material with a dielectric constant that is less than a dielectric constant of a glass material reduces a dielectric mismatch between the glass material and the encapsulating resin. A reduction of a difference between an effective dielectric constant of a resin-filled portion of a hollow glass filament and the dielectric constant of the encapsulating resin may be sufficient to mitigate/prevent skew in a printed circuit board.

In the particular embodiment illustrated in FIG. 5, operations associated with an example process of forming a printed circuit board core layer from a pre-impregnated material including hollow glass filaments are identified as operation 502, while operations associated with filling at least a portion of the hollow glass filaments with a resin and curing the resin are illustrated as operations 504-508. It will be appreciated that the operations shown in FIG. 5 are for illustrative purposes only and that the operations may be performed at alternative times, by a single entity or by multiple entities, or a combination thereof. As an example, one entity (e.g., a fiberglass manufacturer) may perform operations associated forming hollow glass filaments, the same or different entity may perform operations associated with forming a glass fiber substrate from the hollow glass filaments, while another entity (e.g., a pre-impregnated material manufacturer) may form a pre-impregnated material that includes the glass fiber substrate. As another example, one entity (e.g., a printed circuit board manufacturer) may perform operations associated with forming a printed circuit board core layer. Further, alternative or additional entities (e.g., the printed circuit board manufacturer or another entity) may perform operations associated with forming a through-hole in the printed circuit board core layer, causing a resin to flow into exposed open ends of the hollow glass filaments, and/or curing the resin.

In the particular embodiment illustrated in FIG. 5, the process 500 includes forming a printed circuit board core layer from a pre-impregnated material, at 502. The pre-impregnated material is a composite material that includes a glass fiber substrate of hollow glass filaments that is coated with a first resin. For example, a pre-impregnated material including a glass fiber substrate that is encapsulated within a partially cured resin may be used to form the printed circuit board core layer 302 illustrated in FIG. 3. While not shown in FIG. 3, the partially cured resin (of the pre-impregnated material) may be cured in order to form the polymeric matrix material 304 that encapsulates the glass fiber substrate of the printed circuit board core layer 302.

The process 500 includes forming a through-hole (or multiple through-holes) in the printed circuit board core layer to expose open ends of the hollow glass filaments, at 504. For example, referring to FIG. 3, one or more through-holes may be formed in the printed circuit board core layer 302 in order to expose the open ends of the hollow glass filaments (encapsulated within the polymeric matrix material 304).

The process 500 includes causing a resin mixture to flow into the open ends of the hollow glass filaments, at 506. The resin mixture includes a resin (e.g., the first resin or a second resin having a different viscosity) and a curing agent (e.g., a thermal initiator) that enables the resin to be cured in place. For example, referring to FIG. 3, after forming the through-hole(s), the resin mixture 306 may flow into the exposed open ends of the hollow glass filaments.

The process 500 includes curing the resin, at 508. The cured resin has a second dielectric constant that is less than a first dielectric constant of a glass material of the hollow glass filaments. A portion of a hollow glass filament that is filled with the cured resin has an effective dielectric constant that is less than the first dielectric constant of the glass material and that is greater than the second dielectric constant of the cured resin. A reduction of a dielectric mismatch may be sufficient to mitigate/prevent skew in a printed circuit board that results from the dielectric mismatch. For example, referring to FIG. 3, the resin of the resin mixture 306 that at least partially fills the hollow glass filaments to form the resin-filled hollow glass filaments 308 may be cured in place (e.g., by subjecting the board to a thermal bake cycle). As described further herein, when cured, the resin in the resin mixture 306 may have a dielectric constant such that a resin-filled portion of the resin-filled hollow glass filaments 308 has an effective dielectric constant that is sufficient to mitigate/prevent skew associated with dielectric mismatch in a printed circuit board.

Thus, FIG. 5 illustrates an example of a process of forming an article of manufacture (e.g., a printed circuit board) from a composite material (e.g., a printed circuit board core layer formed from a pre-impregnated material) that includes hollow glass filaments encapsulated within a polymeric matrix material (e.g., a first resin). In FIG. 5, a resin (e.g., the first resin or a second resin with a different viscosity) may flow into open ends of the hollow glass filaments that are exposed by forming a through-hole in the printed circuit board core layer. Filling at least a portion of a hollow glass filament with a material with a dielectric constant that is less than a dielectric constant of a glass material reduces a dielectric mismatch between the glass material and the encapsulating resin. A reduction of a difference between an effective dielectric constant of a resin-filled portion of a hollow glass filament and the dielectric constant of the encapsulating resin may be sufficient to mitigate/prevent skew in a printed circuit board.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. An article of manufacture, comprising:
a composite material comprising hollow glass filaments encapsulated within a first portion of a polymeric matrix material,
the hollow glass filaments having an inner diameter and an outer diameter and formed from a glass material having a first dielectric constant,
at least one of the hollow glass filaments comprising:
a first end opposite a second end,
an unfilled portion between the first and second end,
a filled portion disposed in at least the first or second end, the filled portion comprising a second portion of the polymeric matrix material, the polymeric matrix material comprising an average wick length less than a length between the first and second end of the at least one of the hollow glass filaments,
the second portion of the polymeric matrix material has a second dielectric constant that is less than the first dielectric constant, and
the at least one of the hollow glass filaments only partially filled with the second portion of the polymeric matrix material has an effective dielectric constant that is less than the first dielectric constant and that is greater than the second dielectric constant; and
wherein a difference between the effective dielectric constant of the partially filled glass filament and the second dielectric constant is 0.4 to 2 at 1 GHz.

2. The article of manufacture of claim 1, wherein the polymeric matrix material comprises a partially cured resin.

3. The article of manufacture of claim 1, wherein the article of manufacture comprises a printed circuit board layer.

4. The article of manufacture of claim 3, wherein
the printed circuit board layer is formed from the composite material,
the first portion of the polymeric matrix material comprises a first resin having a first viscosity, and
the second portion of the polymeric matrix material comprises a second resin having a second viscosity that is less than the first viscosity.

5. The article of manufacture of claim 3, wherein the glass material comprises an E-glass material.

6. The article of manufacture of claim 3, wherein the first dielectric constant is in a range of 6.0 to 6.5 at 1 GHz.

7. The article of manufacture of claim 3, wherein the first dielectric constant is in a range of 6.1 to 6.4 at 1 GHz.

8. The article of manufacture of claim 3, wherein the effective dielectric constant is in a range of 4 to 5 at 1 GHz.

9. The article of manufacture of claim 3, wherein the effective dielectric constant is in a range of 4.2 to 4.8 at 1 GHz.

10. The article of manufacture of claim 3, wherein the polymeric matrix material further comprises a thermal initiator.

11. A printed circuit board layer comprising a composite material, the composite material comprising hollow glass filaments encapsulated within a first portion of a polymeric matrix material and a plurality of through holes,
the hollow glass filaments formed from a glass material having a first dielectric constant,
at least one of the hollow glass filaments comprising:
a first end defined at a first through hole of the plurality of through holes,
a second end defined at a second through hole of the plurality of through holes,
an unfilled portion between the first and second end,
a filled portion disposed in at least the first or second end comprising a second portion of the polymeric matrix material, the at least one of the hollow glass filament is free of openings between the first and second end, the second portion of the polymeric matrix material having a second dielectric constant less than the first dielectric constant,
the at least one of the hollow glass filaments having an inner diameter and an outer diameter,
the at least one of the hollow glass filaments having an effective dielectric constant less than the first dielectric constant,
the at least one of the hollow glass filaments having an effective dielectric constant greater than the second dielectric constant, and
the polymeric matrix material comprising a cured resin.

12. The printed circuit board layer of claim 11, wherein a difference between the effective dielectric constant and the second dielectric constant is 0.4 to 2 at 1 GHz.

13. The printed circuit board layer of claim 11, wherein the glass material comprises an E-glass material.

14. An article of manufacture comprising:
a printed circuit board layer comprising a composite material comprising hollow glass filaments encapsulated within a first portion of a polymeric matrix material, wherein:

the hollow glass filaments are formed from a glass material having an inner diameter of about 20 μm, an outer diameter of about 25 μm, and a first dielectric constant, at least one of the hollow glass filaments comprising a first end and a second end is only partially filled with a second portion of the polymeric matrix material comprising a cured resin, the at least one of the hollow glass filaments is free of openings between the first and the second end, the cured resin has a second dielectric constant that is less than the first dielectric constant, and the at least one of the hollow glass filaments only partially filled with the second portion of the polymeric matrix material has an effective dielectric constant that is less than the first dielectric constant and that is greater than the second dielectric constant; and wherein a difference between the effective dielectric constant and the second dielectric constant is 0.4 to 2 at 1 GHz.

15. The article of manufacture of claim 14, wherein the glass material comprises an E-glass material.

16. The article of manufacture of claim 1, wherein only a volume fraction of the at least one of the hollow glass filaments is filled with the second portion of the polymeric matrix material, and wherein the effective dielectric constant depends on the volume fraction.

17. The article of manufacture of claim 16, wherein the volume fraction is above 0.5.

18. The printed circuit board layer of claim 11, wherein the through holes are plated.

19. The article of manufacture of claim 1, wherein the average wick length is less than 500 μm from the first or second end of the at least one of the hollow glass filaments.

20. The article of manufacture of claim 1, wherein the hollow glass filaments comprise an inner diameter of about 20 μm and an outer diameter of about 25 μm.

* * * * *